United States Patent [19]

Sichmann et al.

[11] Patent Number: 5,403,663
[45] Date of Patent: Apr. 4, 1995

[54] PROCESS FOR COATING A POLYCARBONATE SUBSTRATE WITH AN ALUMINUM-SILICON ALLOY

[75] Inventors: Eggo Sichmann, Gelnhausen; Thomas Krug, Hanau; Jürgen Meinel, Dreieich; Dan Costescu, Mühlheim/Main, all of Germany

[73] Assignee: Leybold Aktiengesellschaft, Hanau, Germany

[21] Appl. No.: 274,582

[22] Filed: Jul. 13, 1994

Related U.S. Application Data

[63] Continuation of Ser. No. 979,476, Nov. 23, 1992, abandoned, which is a continuation of Ser. No. 402,471, Sep. 5, 1989, abandoned.

[30] Foreign Application Priority Data

Jun. 12, 1989 [DE] Germany .......... 39 19 148.8

[51] Int. Cl.$^6$ .......................................... C23C 14/34
[52] U.S. Cl. .................. 428/412; 204/192.14; 204/192.15; 204/192.27
[58] Field of Search .............. 204/192.14, 192.15, 204/192.16, 192.27; 428/412

[56] References Cited

U.S. PATENT DOCUMENTS

| | | | |
|---|---|---|---|
| 4,125,446 | 11/1978 | Hartsough et al. | 204/192 |
| 4,364,792 | 12/1982 | Gliem et al. | 156/628 |
| 4,547,279 | 10/1985 | Kiyota et al. | 204/298 |
| 4,769,291 | 9/1988 | Belkind et al. | 428/630 |

*Primary Examiner*—John Niebling
*Assistant Examiner*—William T. Leader
*Attorney, Agent, or Firm*—Felfe & Lynch

[57] ABSTRACT

A DC source 10 connected to an electrode 5 is disposed in a coating chamber which can be evacuated. The electrode is electrically connected to a target 3 which is sputtered and the sputtered particles are deposited on the substrate, while a process gas is introduced in the coating chamber 15, 15a. The target is made of an aluminum-silicon alloy which may contain 0.5 to 2.0 percent silicon and 99.5 to 98.0 percent aluminum in order to improve the adhesive strength and the service life of the layer 2. The substrate may be made of polycarbonate.

2 Claims, 1 Drawing Sheet

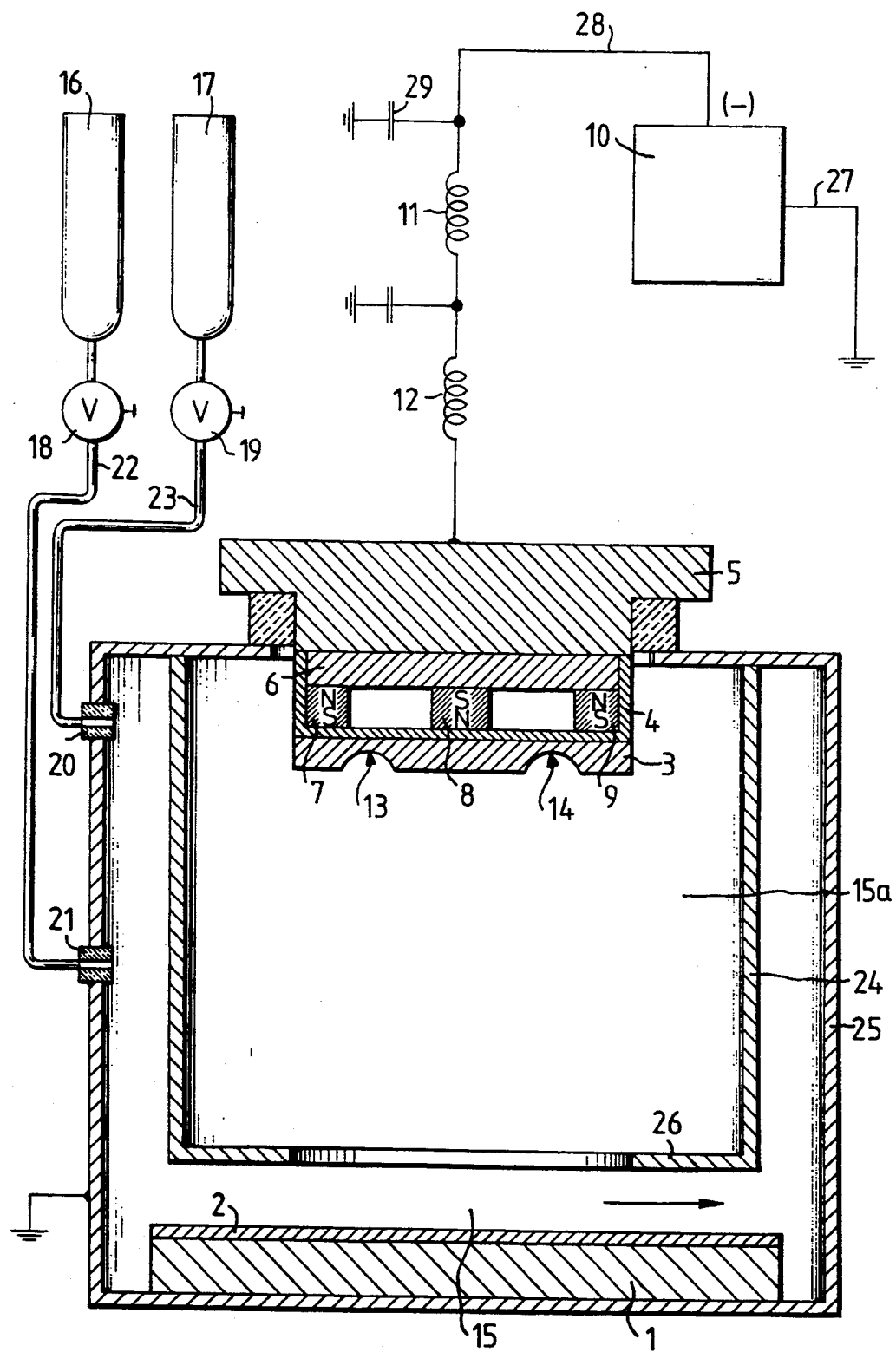

PROCESS FOR COATING A POLYCARBONATE SUBSTRATE WITH AN ALUMINUM-SILICON ALLOY

This application is a continuation of application Ser. No. 07/979,476, filed on Nov. 23, 1992, now abandoned, which is a continuation of Ser. No. 07/402,471, filed on Sep. 5, 1989, now abandoned.

BACKGROUND OF THE INVENTION

The invention relates to a process for coating a substrate preferably made of a plastic material, with aluminum, including a direct current source which is connected to an electrode disposed in a coating chamber which can be evacuated. The electrode is electrically connected to the target to be sputtered and the sputtered particles are deposited on the substrate while a process gas is present in the coating chamber.

In known processes an aluminum layer is directly sputtered onto the plastic substrate, e.g. polycarbonate, without an intermediate or adhesive layer.

This process has the disadvantage of limiting the adhesive strength of the aluminum to a great extent. It turned out that when the coated substrates are stored over a longer period of time the layer, for example, can corrode.

SUMMARY OF THE INVENTION

Hence, it is an object of the present invention to provide a process which is suited to significantly improve the service life of a sputtered aluminum layer on a plastic substrate, e.g. polycarbonate, so that present conventional devices and systems are not rendered unfit for this purpose or that no fundamental technical reassembling or change which involves a high amount of labor and cost becomes necessary.

This object is achieved in accordance with the invention in that the target to be sputtered consists of an alloy containing 0.5 to 2.0% silicon and 99.5 to 98.0% aluminum.

BRIEF DESCRIPTION OF THE DRAWING

The sole figure is a diagrammatic side section view of a sputtering device for DC-sputtering according to the present invention.

DETAILED DESCRIPTION OF THE PREFERRED EMBODIMENT

The drawing shows a substrate 1 which is to be provided with a thin electrically conductive layer 2. A target 3 to be sputtered is placed opposite the substrate 1. Via element 4 which has a U-shaped cross section, the target 3 is connected to an electrode 5 which rests on a yoke 6. Three permanent magnets 7, 8, 9 are enclosed between this yoke 6 and the element 4. The polarities of the poles of the three permanent magnets 7, 8, 9 are directed toward the target 3 and alternate such that together with the north pole of the center permanent magnet 8, the south poles of the two external magnets, respectively, generate an approximately circular arc-like magnetic field. This magnetic field compresses the plasma before the target 3 such that it reaches its highest density where the magnetic fields are at the maximum of their circular arc. The ions in the plasma are accelerated by an electric field which is generated due to a constant voltage which is produced by a DC-source 10. With its negative pole, this DC source 10 is connected via two inductive resistors 11, 12 to the electrode 5. The electric field is vertical on the surface of the target 3 and accelerates the positive ions of the plasma in direction toward this target. A more or less great number of atoms or particles are thus knocked out of the target 3, particularly out of the areas 13, 14, where the magnetic fields are at a maximum. The sputtered atoms or particles travel in direction toward the substrate 1 where they are deposited as a thin layer 2.

For controlling the arrangement as represented a process control computer can be used which computes the measured data and supplies control commands. The values of the partial pressure which was measured can, for example, be fed to this process control computer in the process chamber 25. Based on this and other data, this computer can control the gas flow via valves 18, 19 and adjust the voltage at the cathode. The process control computer is also capable of controlling all other variables, for example cathode current and magnetic field strength. Since process control computers of this kind are known, the design description thereof can be omitted.

In order to improve the corrosion resistance of the layer 2 on the substrate, the target 3 consists of an alloy of 0.5 to 2.0% silicon and 99.5 to 98.0% aluminum.

The result is a significant increase of the layer quality with regard to reducing the depth of the oxidization and the barrier properties as compared to a conventional target made of pure aluminum.

LISTING OF PARTS 1 substrate
2 layer
3 target
4 U-shaped element
5 electrode
6 yoke
7 permanent magnet
8 permanent magnet
9 permanent magnet
10 DC source
11 inductive resistor
12 inductive resistor
13 sputtering gap (area)
14 sputtering gap (area)
15, 15a chamber, coating chamber
16 gas cylinder
17 gas cylinder
18 valve
19 valve
20 inlet
21 inlet
22 gas supply line
23 gas supply line
24 container
25 container, process chamber
26 diaphragm
27 electric connection ( grounding cable )
28 electric connection
29 capacitor

We claim:

1. Process for coating a polycarbonate substrate with an aluminum alloy having improved adhesion and corrosion resistance, comprising the steps of providing an electrode in a coating chamber which can be evacuated, said electrode being connected to a DC power source;

providing a target consisting of an alloy containing 0.5 to 2.0 percent silicon and 99.5 to 98.0 percent aluminum in said chamber, disposing said polycarbonate substrate in said chamber opposite said target;

introducing a process gas in said coating chamber; and sputtering said target to deposit a coating consisting of 0.5 to 2.0 percent silicon and 99.5 to 98.0 percent aluminum directly on said substrate.

2. A coated substrate comprising a polycarbonate substrate and an aluminum alloy coating having improved adhesion and corrosion resistance sputtered directly thereon, said coating consisting of 0.5 to 2.0 percent silicon and 99.5 to 98.0 percent aluminum.

* * * * *